United States Patent [19]

Wang et al.

[11] Patent Number: 4,652,766

[45] Date of Patent: Mar. 24, 1987

[54] DIRECT COUPLED CHARGE INJECTION READOUT CIRCUIT AND READOUT METHOD FOR AN IR SENSING CHARGE INJECTION DEVICE

[75] Inventors: Samuel C. Wang, Liverpool; John M. Swab, Baldwinsville, both of N.Y.

[73] Assignee: General Electric Company, Syracuse, N.Y.

[21] Appl. No.: 809,396

[22] Filed: Dec. 16, 1985

[51] Int. Cl.$^4$ .............................................. H01J 40/14
[52] U.S. Cl. .................................... 250/578; 250/370
[58] Field of Search ............. 250/370 G, 332, 338 SE, 250/578, 211 J; 358/212, 213

[56] References Cited

U.S. PATENT DOCUMENTS 3,983,395  9/1976  Kim .................................. 250/370 G
4,054,797  10/1977  Milton et al. .................... 250/370 G
4,259,576  3/1981  Gridley et al. ................... 250/370 G Primary Examiner—David C. Nelms
Assistant Examiner—William L. Oen
Attorney, Agent, or Firm—Richard V. Lang; Carl W. Baker

[57] ABSTRACT

The invention relates to an improved readout circuit and readout method for an IR sensing array. The invention, given a limited time interval for reading out the signal from a sensor element in an array of sensor elements, permits a longer time to be devoted to the injection of charges into the substrate, thereby reducing device "lag" (the retention of uninjected charges). The readout is carried out by a two step, direct coupled, injection process. The first step involves independent, but simultaneous resetting of the sensor elements and the preamplifier input (at a node having sufficient capacity to supply the charges required for injection). The voltages are suitable for IR induced charge storage in the sensor elements, and for subsequent injection by the nodal capacity. A first sample is taken by a correlated double sampling circuit from the preamplifier output during the first step as the resetting stabilizes. In the second step, the selected sensor element is connected to the preamplifier input to cause the charge injection. At the same time the preamplifier is responding to the charge transfer. The second sample is taken from the preamplifier output at the end of injection. The reduction in lag over conventional AC coupled readout circuits is 80%.

2 Claims, 6 Drawing Figures

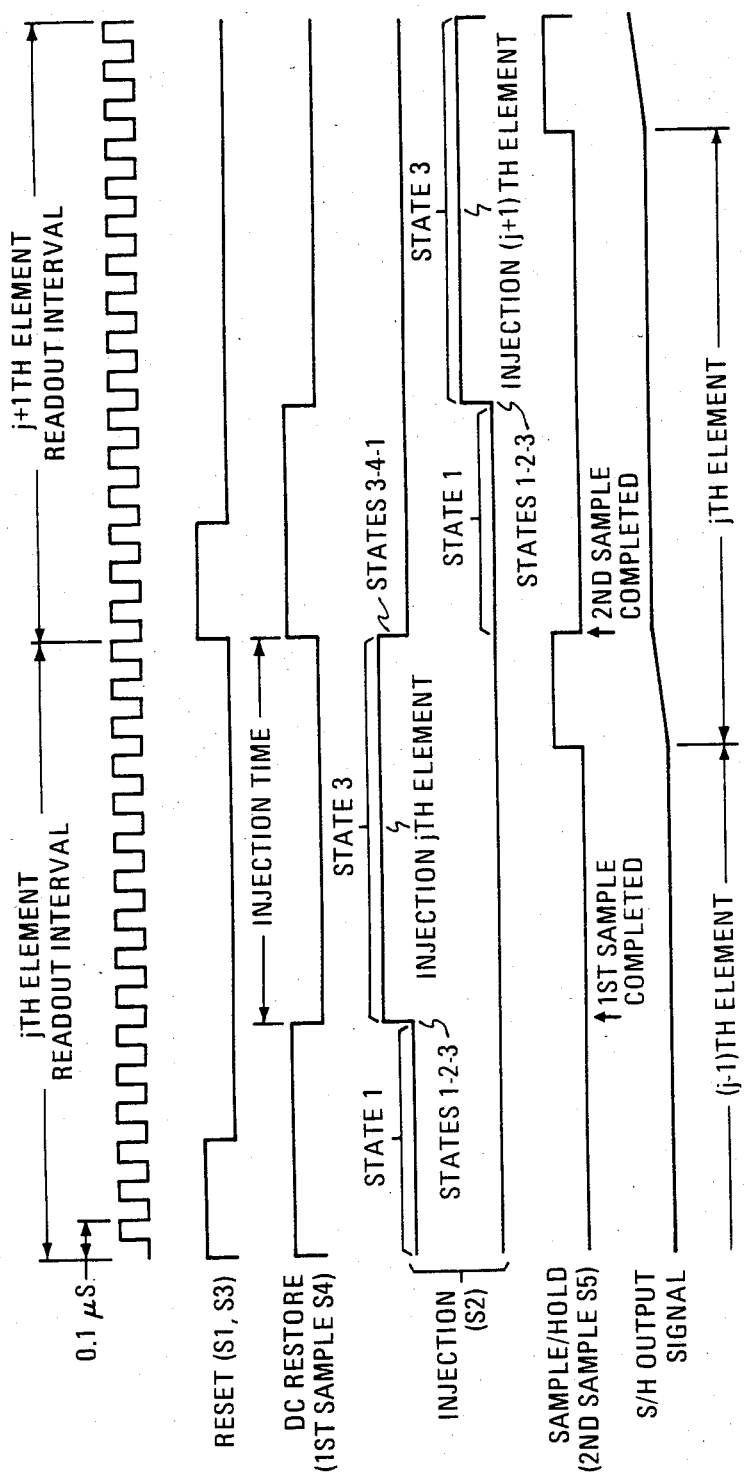

DIRECT COUPLED CHARGE INJECTION READOUT CIRCUIT AND READOUT METHOD FOR AN IR SENSING CHARGE INJECTION DEVICE

BACKGROUND OF THE INVENTION

1. Field of the Invention

The invention relates to charge injection devices optimized for IR sensing and more particularly to an improved readout circuit for a linear IR sensing array.

2. Prior Art

IR sensing CID arrays are well known, the sensor substrate material often being Indium Antimonide (InSb) or mercury cadmium telluride (HgCdTe). These materials are compound semiconductors which are doped to achieve a desired impurity level.

When exposed to IR, photon collisions create hole-electron pairs in the substrate. In the usual construction, an electrode is applied to the under surface of the substrate, and an oxide layer is applied to the upper surface of the substrate, followed by a transparent electrode identified with a particular sense element of the array on the upper surface of the oxide. The sensor element, with its insulated electrode, when suitably reversely biased, stores IR induced charges (the holes) in a potential well. If the reverse bias is removed, the charges are injected into the substrate emptying the well. Readings reflecting the IR induced charge on the sensor may be taken before and after injection if one wishes to measure the IR intensity. In practical devices, where there are a large number of elements, as in a linear IR array, there is a need to take a large number of readings in a relatively short time. In practice, each reading of a sensor element is a double sample, and the readout process requires that the charge stored in the potential well be "injected" into the substrate. The injection, however, is not instantaneous, and as the injection step is shortened below several microseconds, a substantial percentage of uninjected charge occurs, and the sensitivity of the IR sensor is reduced. For instance, if the injection time of the sensor can be as long as 10 microseconds, the lag described is negligible. On the other hand, if the injection time is in smaller than 10 nanoseconds only a very small percentage of charge is injected.

In CID IR sensor arrays of practical interest, the readout interval allocated to each sensor element has become so short, (e.g. 1.6 microsecond) that the injection time, which is a part of the readout interval, is so small that the device lag presents a significant reduction in performance.

SUMMARY OF THE INVENTION

Accordingly it is an object of the present invention to provide an improved readout circuit in a charge injection device (CID) for IR sensing.

It is another object of the invention to provide a readout circuit in a charge injection device for IR sensing having reduced device lag.

It is still another object of the invention to provide an improved method of readout of charge in a charge injection device (CID) for IR sensing.

These and other objects of the invention are achieved in the readout of a charge injection device for IR sensing in which the CID comprises n IR sensor elements arranged in an array on a common substrate, each sensor element when reversely biased to a first voltage forming a potential well in which IR induced charges are stored, and a readout circuit having n input terminals, each connected to a sensor element, a node connecting a sensing line, and the input of amplification means, also comprised, said node exhibiting a capacitance.

The novel readout method comprises the steps of simultaneously biasing all sensor elements to a first voltage and the node to a second voltage, the second voltage having a value suitable for emptying the potential wells of said sensor elements.

A first sample of the voltage on said node at the output of said amplification means is obtained after the node has been reset to the second voltage but prior to the following step.

As a next step, the IR induced charges stored in a selected jth sensor element are injected into the substrate by connecting the selected (jth) sensor element to the node to cause the voltage on said node and on the selected sensor element to equalize.

A second sample of the voltage on said node at the output of said amplification means is obtained during injection, which when combined with the first sample provides a readout for the jth sensor element.

At this point injection may be terminated and the steps 1, 2, etc. repeated for the (J+1)th sensor element, until n sensor elements have been read out.

The circuit for carrying out the foregoing method is simpler than prior art circuits for AC injection, and by eliminating an injection step which must be completed before a second sample can be taken on the sensing line, increases the injection time for a given readout period. By allowing increased injection time, the device lag is reduced and the IR sensitivity increased.

BRIEF DESCRIPTION OF THE DRAWINGS

The invention and distinctive features of the invention are set forth in the claims of the present application. This invention itself, however, together with further objects and advantages thereof, may best be understood by reference to the following description and accompanying drawings in which:

FIG. 2A is an equivalent circuit representation of the sensor element and readout circuit; FIG. 2B is a V/Q diagram of the readout process; and FIG. 2C is an idealized electrical waveform illustrating both the voltage at the sensor element and at the input to the amplifier of the readout circuit;

FIG. 3 illustrates the timing waveforms applicable to the readout of two successive elements of a sensor array.

DESCRIPTION OF THE PREFERRED EMBODIMENT

Figure 1:
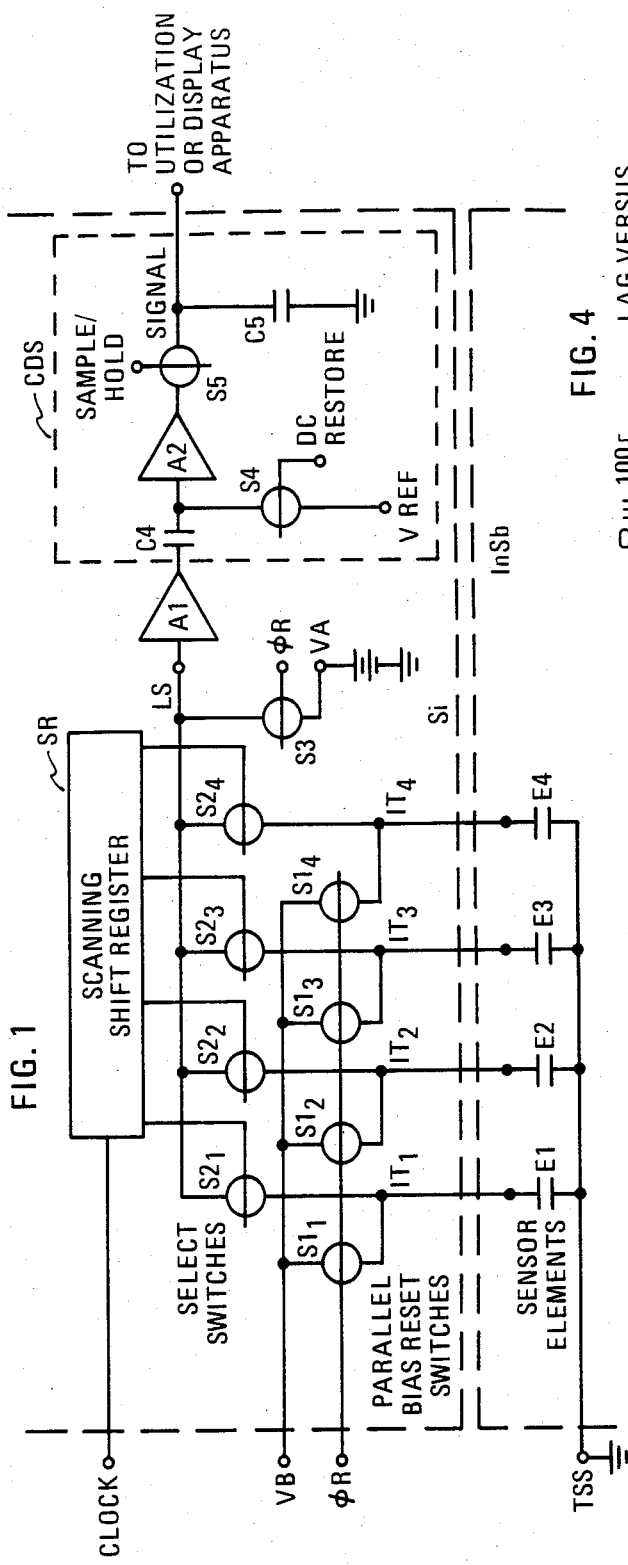
FIG. 1 is a diagram of a charge injection device (CID) for IR sensing including an IR sensor and a novel readout circuit which minimizes device "lag" of a CID device in an application where the time for reading out the signal on each sensor element is limited.

Referring now to FIG. 1, a linear charge injection device (CID) for infrared (IR) sensing is shown combining a linear IR sensor array with a novel readout circuit for electrically scanning the array. The sensor array is typically formed on a first integrated circuit of IR sensitive material typically Indium Antimonide (InSb), while the readout circuit is formed on a second, separate integrated circuit of silicon.

The CID forms a portion of a larger system in which an infrared image of an object field is formed. The readout circuit, which electronically scans the elements of the array, permits the formation of an individual line of an image of the object field. The resolution of the image measured along the line of elements is proportional to the number of elements. To complete the image, mechanical means are provided to cause the line of the object field imaged on the CID array to be swept in a direction transverse to the line image. A full area image of the object field is then formed by supplying the outputs of the readout circuit taken at successive imaging positions to a suitable display device. Here again the resolution of the image transverse to the line image is proportional to the number of imaging positions. Dependent upon application, the image display provides means to store elements (pixels) of the image for an appreciable portion of the scanning interval to create a full area image of the object field, optimally persistent for the nature of the display.

The IR sensing array consists of an "essentially" linear sequence (as will be explained) of individual sensing elements of which four are illustrated (E-1 to E-4). It is understood that the actual array will entail a larger number of elements (e.g. 64, 128, 256, 512, etc.). The individual sensor elements are two terminal devices approximately represented in FIG. 1 by capacitors. A more descriptive representation of a sensor element is provided in FIG. 2A, in which the representation includes two capacitors CO and CD and optionally a diode D and variable voltage source (VD).

The sensor array has an IR active substrate typically 0.020 inch thick which has a resistivity suitable for CID operation. The undersurface of the substrate is electroded to provide a contact common to all sensor elements leading to a terminal $T_{ss}$. The terminal $T_{ss}$ may be led to the top surface of the substrate. The region of the substrate which is active in the IR sensing, is a very thin region rarely more than a few microns in thickness, at the top near the interface with an oxide layer, yet to be described.

The second terminal for each element of the sensor array is provided by a metal-insulator-semiconductor (MIS) gate of which the uppermost layer is an IR transparent conductive layer of chromium (i.e. M), and the undermost layer of insulating silicon dioxide (i.e. I). The "S" is the IR sensitive substrate material (i.e. InSb). The insulating $SiO_2$ layer and the uppermost portion of the InSb enter into the IR sensing mechanism. Charges which are created in the IR sensing process are said to be stored in a "potential well" at their interface.

In addition to the "gates", patterned metallizations are required to provide the electrical connections illustrated in FIG. 1 for connecting the IR sensor elements to pads on the InSb substrate for further connection to pads on the silicon readout chip.

As the drawing suggests, the preferred application of the invention is to a "linear" (as opposed to an area) array of sensor elements. The remainder of FIG. 1 deals with the novel readout circuit.

The novel readout circuit is the separate integrated circuit forming a second part of the CID device. It is a scanning device operating at rates commensurate with the number of "pixels" in the image. It is typically formed by a MOS process on a silicon substrate. It electrically scans the successive elements of the sensor array and delivers a signal proportional to the intensity of the IR signal developed at the successive sensor elements in a serial format along a single path to the output terminal (TO) for the CID.

The readout circuit includes a number (n) of nput terminals ($IT_{1, 2, 3 \ldots n}$) four only being illustrated, each connected to one of a corresponding number (n) of elements in the sensor array. The readout circuit concludes with the single signal output terminal (TO), mentioned above.

The readout circuit depicted in FIG. 1 further comprises a first bias voltage source (VB), n controllable bias reset switches $S1_{1-n}$ for periodically biasing the n sensor elements of the array to integrate the charge created by IR exposure; a second voltage source (VA) coupled to the sensing line (LS) having a value tending to remove stored charge from the sensor elements and a switch (S3) for periodically applying the second source to the sensing line (LS); a scanning shift register (SR) and an n fold plurality of sensor select switches $S2_{1-n}$ for selecting the sensor element to be connected to the sensing line (LS) for readout, an amplifier (A1) coupled to the sensing line, and a correlated double sampling circuit (CDS) by which the amplified sensor outputs, derived sensor element by sensor element, are processed to obtain the output at terminal (TO).

The bias voltage is applied to all sensor elements at the element readout (pixel) rate to maintain the charge storage capacity in all elements. As seen in FIG. 1, the (jth) input terminal of the terminal set ($IT_{1-n}$) of the readout circuit is connected to one terminal of the jth reset switch ($S1_j$) (and to one terminal to the jth select switch ($S2_j$) for eventual readout). The other terminal of the bias reset switch ($S1_j$) is connected to the bias source (VB). The switch $S1_j$ is controlled by the reset waveform phi R illustrated in FIG. 3, which closes the switch and connects the jth sensor element to the bias source (VB) when the reset waveform goes high. The reset waveform goes high at the start of the element readout interval, and remains high during a preliminary portion (three clock intervals) of the element readout interval (1.6 microsecond=16 clock intervals).

The IR induced charge, accumulated during the integration period at the sensor elements, is removed element by element and its removal is sensed on the sensing line (LS) coupled to the input of amplifier A1. The elements involved in sensing the stored charge are the switch (S3), the voltage source (VA), the scanning shift register (SR), and the select switches ($S2_{1-n}$).

The select switches $S2_{1-n}$, whose first terminals are connected to the sensor elements, have their second terminals connected to the sensing line (LS) leading to the input of the amplifier (A1). The control inputs of the select switches are connected to the shift register (SR). The sensing line (LS) is also connected to one terminal of the amplifier reset switch S3 whose other terminal is connected to the voltage source (VA). The VA voltage is selected to empty the IR induced charge stored in the potential well of each sensor element. The control terminal of the switch S3 is connected to a source of the waveform phi R to effect sense line reset and amplifier input reset.

Resetting of the amplifier input occurs once for each sensing operation and is done in synchronism with the resetting of the bias resetting switches $S1_{1-n}$. Resetting standardizes the charge of the stray capacitance CA associated with the sensing line and amplifier input, and makes the reading of each element more accurate and less subject to variation due to variations in the signal level of the previously read element (cross talk).

The scanning shift register (SR), which selects successive sensor elements for readout, is controlled by an external clock (not illustrated) to produce successive logical highs on the n output terminals (four terminals only being illustrated), which are individually connected to the control terminals of the select switches ($S2_{1-n}$).

The readout of the individual sensor elements, occurs in the following manner. When the reset waveform phi R goes high at the beginning of the jth element readout interval, switch S3 connects the sensing line LS to VA, in readiness to allow the charge removal to take place. Switch S1, controlled by the same waveform, is synchronously resetting the jth sensor element to VB. Closure of S3 charges the stray capacitance CA at the sensing line, including the stray capacitance at the output terminals of the switches $S2_{1-n}$ S3, and at the input of the amplifier A1, to the voltage of VA. Resetting the sensing line and sensor element continues for three clock intervals. At the end of the sixth clock interval, the scanning waveform from the shift register goes high, turning on the select switch $S2_j$. The select switch $S2_j$, now turned on, couples the selected sensor element to the sensing line, the sensing line potential being above the bias potential. This causes the potential well in the selected sensor element to collapse, and the charge stored in the element flows into the substrate, momentarily increasing the potential on the selected sensor element, and momentarily decreasing the potential at the amplifier input, as generally illustrated in FIGS. 2B and 2C.

Figure 2A:
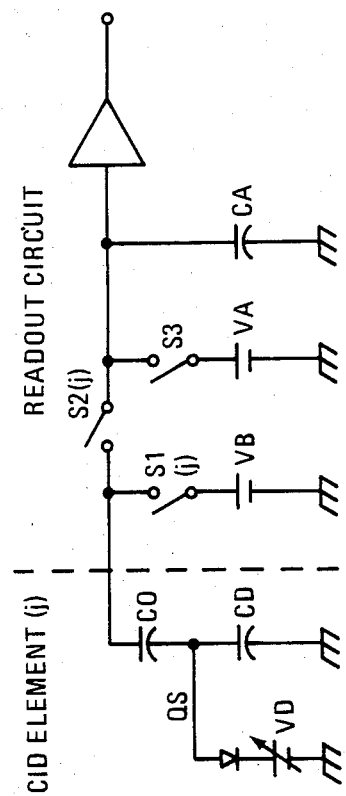
FIGS. 2A, 2B and 2C deal with the readout operation of the readout circuit in deriving the signal from a single element of the sensor array.
Figure 2C:
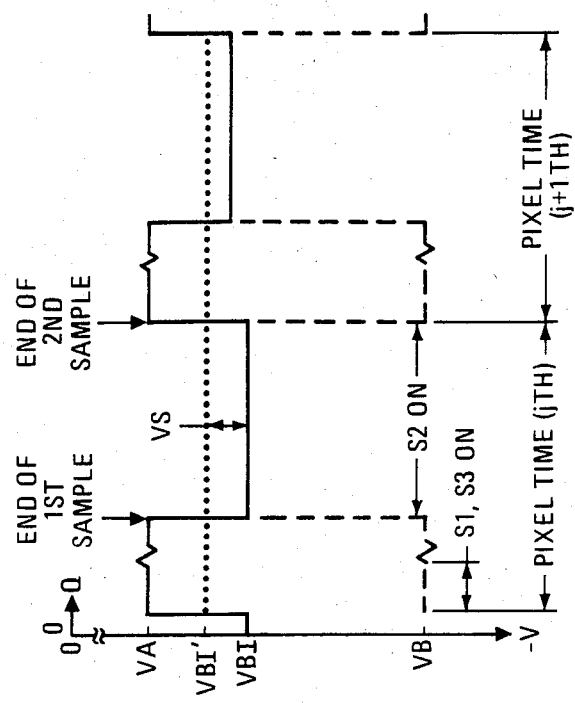
Figure 2B:
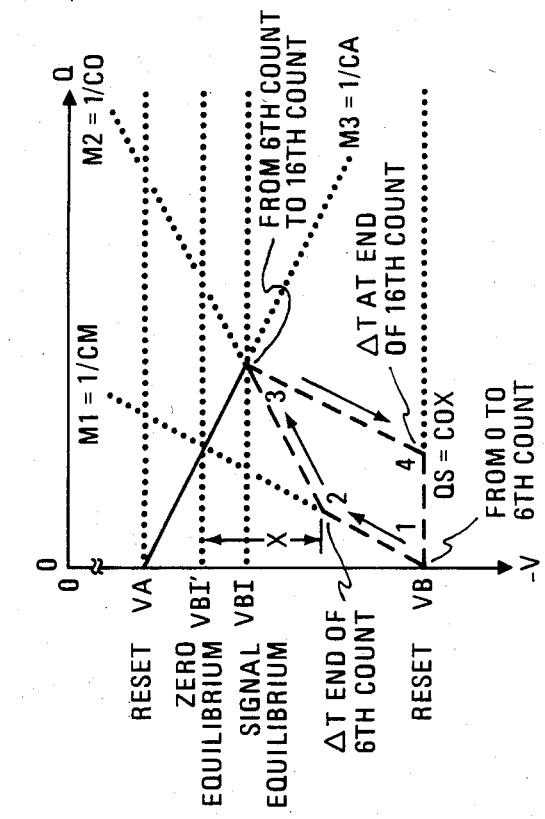

The voltage waveforms produced during sensing at the selected sensor element are illustrated in FIG. 2C and explained in the equivalent circuit of FIG. 2A, and V/Q diagram of FIG. 2B.

FIG. 2A equivalently represents the sensor element as a two terminal, four component device. The capacitance of the oxide layer CO is illustrated connected in series with the capacitance of the depletion layer, CD, at the interface between the oxide and the InSb semiconductor. The capacitance CD is shunted by an ideal diode (D) in series with a variable voltage (VD). The shunting elements are attributable to the stored charge in the potential well created by a suitable reverse bias (VB). The equivalent circuit implies that when the variable potential well disappears, the battery VD, back biasing the diode (D) will also disappear. This allows the diode to be conductive for current flowing into the substrate, and to act as a short circuit in shunt in CD.

The dashed lines in FIGS. 2B and 2C represent the voltage/charge (V/Q) states, and voltage/time states respectively of the sensor element, while the solid lines represent the voltage/charge or voltage/time states respectively at the sensing line. FIG. 2B is a simplified piecewise linear treatment of the readout process.

As seen in the V/Q diagram of FIG. 2B, after resetting, the sensor element is at the initial state (VB, 0) of a four state readout cycle. The readout cycle is indicated by four dashed line segments forming a closed figure. At the initial state (VB, 0), the bias voltage VB has the most negative value that it experiences during the cycle and the Q is assumed to be zero. At the instant that injection begins, and the potential well begins to diminish, the first line segment is traced as Q increases and the voltage increases at a slope corresponding to the quantity M1. The quantity M1 is the reciprocal of the capacitance of the sensor element when the potential well is present, with diode D back biased by VD:

$$CM = COCD/(CO+CD).$$

As the potential well continues to diminish, the capacitance CD attributable to the well is removed as the diode conducts and short circuits it. This changes the slope of the V/Q graph, and the second line segment has the slope M2, corresponding to the reciprocal of CO, the capacitance of the oxide alone.

Meanwhile at the sensing line (LS), charge (Q) is flowing out of the stray capacitance CA and into the capacitance of the sensor element. The V/Q diagram of the sensing line in FIG. 2C is a single solid line that is retraced. The initial state (VA, 0) of the sensing line is at a higher voltage than VB. The discharge from the initial state follows a path having a slope established by the reciprocal of CA. The downward slope continues to a point where the voltages on the sensing line and the sensing element are equal, denoting equalization; the third state in the readout cycle.

After equalization (at the voltage VBI), the readout cycle terminates with resetting taking place in preparation for readout of the (j+1)th sensor element.

After the equalization, the switch $S2_j$ coupling the sensor element to the sensing line opens, and resetting potentials are applied to both the sensor element and to the sensing line via switches S1 and S3. The sensor element now charges in a path represented by the third dashed line having a slope approximately equal to M1 and extending to the fourth state at the voltage VB. Upon reaching VB, the cycle closes with a fourth line leading to the initial state (VB, 0).

As the sensor element is being reset to the initial state, the stray capacitance CA at the sensing line is also reset to the initial voltage (VA). The solid line previously used to indicate a discharging path from the initial state (VA, 0) with a slope M3, is now retraced along a charging path back to the initial state (VA, 0) having an equal but opposite slope.

The waveforms that are produced during the readout cycle of the jth sensor element (just described) are also shown by dashed and solid lines in the V/T plot of FIG. 2C. For purposes of absolute signal level comparisons, a zero signal level is shown as a dotted line extending from VBI' in FIG. 2C. The "zero" signal level is defined to occur at a voltage equal to the voltage at the intersection (at voltage VBI') of an extension of the dashed sensor element line (extending from (VB, 0) at slope M1), and the solid charge/discharge line of the sensing line extending from (VA, 0) at negative slope M3. The extended V/Q sensor line, shown without a break in slope, symbolizes the case for an empty potential well consistent with a zero signal.

In FIG. 2C, the events displayed in V/Q coordinates are now displayed in V/T coordinates. The voltage of the zero signal state, when transferred to FIG. 2C, assumes a dotted level (VBI') between VA and the equilibrium voltage (VBI). The "true" signal level referenced to the zero signal level is indicated by the notation $V_S$.

The readout of the IR signal for the jth and (j+1)th element are graphed in FIG. 3. Previously, in connection with FIGS. 2A and 2B, the events taking place at the jth element were discussed. In the FIG. 3 graph, the initial state (VB, 0) ideally exists to the end of the sixth clock interval, at which the second, and third states of the sensor readout cycle depicted in FIG. 2B take place. The third, or equilibrium state continues from the sixth to near the end of the jth readout interval during the sixteenth clock interval, (during an interval shorter than a clocking interval), the third or equilibrium state terminates, and the cycle quickly passes via the fourth state, to the original state (VB, 0). The initial state (VB, 0) then continues through the next six clock intervals of the readout interval for the (j+1)th element.

As shown in FIG. 3, the reset time takes place during the first three clock intervals followed by three clock intervals for the reset state to equalize before injection. The injection initiated at the sixth clock interval continues to the 16th clock interval and it then terminates as reset for the next sensor element takes place and the cycle begins for that element.

The significance of the long injection time for a given high sampling rate achieved by the present novel readout scheme may be explained as follows. FIG. 2C shows the idealized instantaneous transition to the equilibrium (third) state as the select switch S2 is closed. In reality, due to the nature of the InSb MIS device, the charge injection into the substrate takes place gradually. A practical measure of injection performance in a given time interval is the "lag". For a given injection time, the charge in the potential well that is not injected as a percentage of the total charge that might have been injected, had there been more time is defined as "lag". The lag is of great concern for the CID as an infrared detector, because it not only degrades the impulse response but with a finite time to complete the readout cycle, it also reduces the usable charge storage capacity of the detector, thus reducing the sensitivity and dynamic range of the CID.

Figure 4:
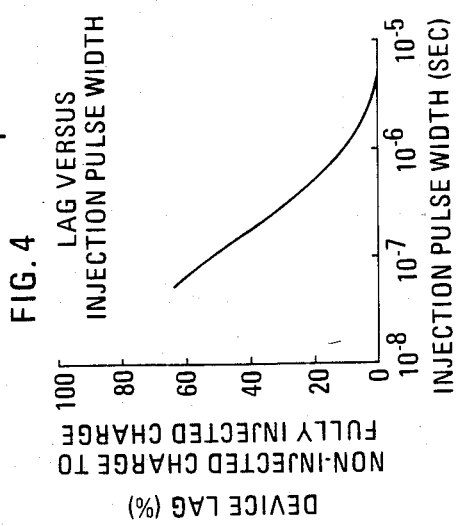
FIG. 4 is a graph used to explain device "lag" and the relationship between device lag and the duration of the injection pulse in readout, device "lag" being reduced by application of the invention.

FIG. 4 shows the experimental dependency on lag (as a percentage of non-injected charge) to the injection pulse width. The time scale is from 10 microseconds ($10^{-5}$ seconds) to 10 nanoseconds ($10^{-8}$ seconds). The lag is substantially nonexistent at several microseconds, in excess of 10% at one microsecond, and about 50% at 1/10th microseconds. This illustrates that an improvement from 10% lag to 50% lag may be achieved by lengthening the injection pulse from 1/10th microseconds to 1 microsecond. In prior arrangements using AC injection, injection times tended to be from a few tenths of a microsecond with the result that injection lag was on the order of 40%. In the present arrangement, the injection time can be 1 microsecond corresponding to an injection lag of 10%. The improvement in signal is approximately 3.5 db.

The period between the third and sixth clock intervals and between the 14th and 16th clock intervals represents relatively stable periods in the cycle corresponding respectively to the reset and to the equilibrium states of the sensor-element and sensing line. Samples are taken of the voltage on the sensing line during these two periods, to obtain a reading of the IR induced charge on the selected (jth) sensor element.

The waveform on the sensing line, represented by the solid line graph of FIG. 2C, is amplified in the amplifier A1, and coupled to the capacitor C4 of the correlated double sampling circuit CDS. The CDS circuit measures the voltage swing on the sensing line between the reset and charge injected states, provides for DC restoration of the signal obtained from the sensing line and by the selection of the sampling provides substantial elimination of the "KTC" noise.

The sampling circuit comprises the elements C4, S4, A2, and S5, C5 which are connected in the following manner. The output of amplifier A1 is coupled to one terminal of the capacitor C4. The other capacitor terminal is connected to one terminal of a controlled switch S4, and to the input of the buffer amplifier A2. The other terminal of the switch S4 is connected to a suitable DC reference voltage VREF. The switch S4 is controlled by the DC restore waveform of FIG. 3. When the waveform goes high during the first six clock intervals, switch S4 is operated to take a "first sample". The output of the buffer amplifier is coupled to one terminal of a second controlled switch (S5). The other terminal of the switch S5 is connected to one terminal of the capacitor C5 (whose other terminal is grounded). The sample/hold waveform of FIG. 3 is coupled to the control of the switch S5. The waveform, which is high during the 14–16th clock intervals, allows the switch S5 to conduct during this period, charging capacitor C5, and obtaining a "readout" of the IR signal, representing the difference between the two samples taken during the jth element readout interval. The value readout is then coupled to the CID output terminal TO, where it represents the value for the jth element. The output of TO is stored on capacitor C5 until the next readout interval at which time it is replaced by the value for the (j+1)th element.

The sensing line reading process, as mentioned earlier, is initiated by closure of the switch S4, which connects the voltage reference VREF, to the near terminal of the capacitor C4. At the first three clock intervals that the first sample is being taken, resetting of the sensing line to VA occurring and the capacitor C4 assumes a charge which establishes a desired voltage difference between VA and the other voltage at the input of the buffer amplifier A2. In practice, the DC restoration offset is set to approximate the zero signal condition. After discontinuance of reset, three more clock intervals are provided to allow the charges flowing into C4 to reach equilibrium. After the sixth clock interval, the sampling waveform goes low, opening the switch S4, and leaving the accumulated charge on C4. Leakage of charge is kept small by the selection of a suitably large capacitance for C4, and assurance that S4 and A2 are of suitably high impedance.

The sampling is quiescent during the initial period (clock intervals 6 to 13) that the IR induced charge on the sensor element is being injected into the substrate. At the 14th clocking interval, after injection is near completion, the sample/hold waveform of FIG. 3 goes high, and so remains until the end of the 16th clock interval (of the jth element readout interval). This closes the switch, S5, allowing capacitor C5 to be charged to a voltage equal to the equilibrium voltage VBI less then offset provided by the charge already present of C4. Thus the output reading $V_S$ is equal to the "true" signal in that undesired DC offsets in the readout process are removed.

At the end of the 16th clock interval, the charging process of C5 has stabilized, and the sample and hold signal goes low. The output is stored on capacitor C5, where the value persists into the 13th count of the readout interval of the j+1th sensor element. To insure that the reading is present sufficiently long, the capacitor C5 is made appropriately high (100 pf), and the utilization or display apparatus is of a suitably high impedance to sustain the signal over the readout interval for the sensor element.

As earlier stated, the present DC coupled injection method permits lower lag when an IR array is being scanned at a high rate limiting the time available for reading out each element. The approximately 40% to 10% lag improvement is achieved by allowing the second sample to be taken simultaneously with injection, eliminating the sequential ordering of these two steps.

In the conventional AC readout approach, where injection is provided by an independent circuit, AC coupled to the sense line at the preamplifier input, the process is essentially a three step sequence. The first step is the reset of the sensor elements and the sensing line followed by a wait for the effect of reset to stabilize as the first sample is taken at the sensing line. This is followed by injection and a wait after injection for the effects of injection to stabilize on the sensing line. The second sample is taken after injection is discontinued, and the amplified waveform allowed to stabilize.

In the present application in which DC coupled injection is employed, readout is accomplished in two sequential steps. The initial step is the reset of the sensor element and the sensing line (i.e. S1, S3 close) is followed by a wait. The first sample is taken after the reset pulse is terminated and the "wait" allows conditions on the sensor element and sensing line to stabilize. This is immediately followed by injection (i.e. S2 close) at the end of which the second sample is taken with both the sensor element and sense line DC connected to the preamplifier. The second sample is completed by the end of injection, terminating the readout sequence for that sensor element in a second, final step.

What is claimed is:

1. In a charge injection device (CID) for IR sensing having reduced device lag, the combination comprising
   A. n IR sensor elements ($E_{1-n}$) arranged in an array on a substrate, each element equivalently representable by a capacitor, diode, and battery network, which when reversely biased to a suitable voltage (VB) forms a potential well in which IR induced charges are stored,
   B. a readout circuit, comprising
      (1) n input terminals ($IT_{1, 2, 3 ... n}$) each connected to one of said n sensor elements $E_{(1-n)}$, a node including a sensing line, and a signal output terminal,
      (2) a first voltage source and n controllable reset switches ($S1_{1, 2, 3 ... n}$), for periodically biasing said sensor elements to said charge storing voltage,
      (3) amplification means having the input thereof coupled to said node, said node exhibiting a capacitance,
      (4) a second voltage source having a value selected to remove charge from said potential well and a reset switch (S3) for periodically resetting said node to said second voltage,
      the resetting of said sensor elements and said node to said first and said second voltages, respectively, occurring simultaneously as the first step in the readout sequence of each sensor element,
      (5) a scanning shift register, and n element select switches ($S2_{1, 2, 3 ... n}$) controlled thereby for connecting successive sensor elements for readout to said node to inject the charges stored in said well into the substrate as the voltage at said node and the selected sensor element equalize at a voltage dependent on IR intensity, said injection being the second step in the sensor readout sequence, and
      (6) a correlated double sampling circuit whose input is connected to said node, and whose output is connected to said signal output terminal for taking a first voltage sample following reset, but prior to injection, and a second voltage sample during injection, the readout value for the selected sensor representing the difference between said first and second sample voltages.

2. An improved method of readout of a charge injection device for IR sensing in which the CID comprises n IR sensor elements arranged in an array on a common substrate, each sensor element when reversely biased to a first voltage forming a potential well in which IR induced charges are stored, and a readout circuit having n input terminals, each connected to a sensor element, amplification means and a node connecting a sensing line and the input of amplification means, said node exhibiting a capacitance, the steps of
   (1) simultaneously biasing all sensor elements to said first voltage and said node to a second voltage, said second voltage having a value suitable for removing charge from the potential wells of said sensor elements,
   (2) obtaining a first sample of the voltage on said node at the output of said amplification means after said node has been reset to said second voltage but prior to the following step,
   (3) injecting IR induced charges stored in a selected jth sensor element into said substrate by connecting said selected sensor element to said node to cause the voltage on said node and on said selected sensor element to equalize,
   (4) obtaining a second sample of the voltage on said node at the output of said amplification means during injection which when combined subtractively with the first sample provides the readout value for the jth sensor element, and
   (5) terminating injection and repeating steps 1, 2, etc. for the (j+1)th sensor element, until n sensor elements have been readout.

* * * * *